United States Patent [19]
Main

[11] Patent Number: 5,365,120
[45] Date of Patent: Nov. 15, 1994

[54] DATA SLICER WITH HOLD

[75] Inventor: W. Eric Main, Mesa, Ariz.

[73] Assignee: Motorola, Inc., Schaumburg, Ill.

[21] Appl. No.: 947,625

[22] Filed: Sep. 21, 1992

[51] Int. Cl.$^5$ ............................................. H03K 5/08
[52] U.S. Cl. .................................... 327/77; 327/165; 327/209
[58] Field of Search ................... 307/261, 268; 328/28, 328/31

[56] References Cited

U.S. PATENT DOCUMENTS

| | | | |
|---|---|---|---|
| 4,652,774 | 3/1987 | Hasegawa | 307/268 |
| 4,686,385 | 8/1987 | Sharpe | 307/261 |
| 4,728,815 | 3/1988 | Main | 307/261 |
| 4,902,970 | 2/1990 | Suquet | 307/261 X |
| 4,943,736 | 7/1990 | Kihara et al. | 307/261 |
| 4,967,099 | 10/1990 | Mori | 307/268 X |

*Primary Examiner*—Willis R. Wolfe
*Attorney, Agent, or Firm*—Bradley J. Botsch

[57] ABSTRACT

A data slicer including a comparator and a clamping circuit has been provided wherein the clamping circuit functions to clamp a signal appearing at a first input of the comparator to a predetermined voltage swing. The first input of the comparator is coupled through a capacitive element to receive an input signal. The clamping circuit includes a first diode being coupled between the first input of the comparator and a first voltage. The clamping circuit also includes a transistor having its current carrying electrodes coupled between a first supply voltage terminal and the first input of the comparator. The control electrode of the transistor is coupled to receive a second voltage. The second input of the comparator is coupled to receive a bias voltage which is substantially equal to the midpoint of the first and second voltages. The data slicer further includes a hold circuit for disabling the clamping circuit.

8 Claims, 2 Drawing Sheets

DATA SLICER WITH HOLD

FIELD OF THE INVENTION

This invention relates, in general, to receivers and, more particularly, circuitry utilized in such receivers to improve the leading and trailing edges of a received signal.

BACKGROUND OF THE INVENTION

High frequency/high gain receiver systems are used in a myriad of applications. For example, digital data communication equipment typically includes a high frequency/high gain frequency shift keying (FSK) receiver. Digital data is received and demodulated as understood. Sometimes the transmitted digital data can become distorted through intermediate stages of the receiver such that the square wave digital data is shaped more like a sine wave. If this is the case, the data must be reshaped, for example, by a data slicer, in order to obtain useful bits of information.

Prior art data slicer/shaper circuits have utilized comparators to square up the data bits. However, in some receivers, for example FSK receivers, the direct current (DC) level of the data signal can drift away from the reference voltage of the comparator. This can be resolved by alternating current (AC) coupling, but then the circuit can no longer handle long strings of bits of one polarity.

This problem was solved in one prior art wide band FSK receiver, the MC3356 receiver manufactured by Motorola, Inc., using back to back clamping diodes across the inputs of a floating comparator. The MC3356 utilized a diode clamp comparator where DC drifts were taken up by a capacitor whose charging and discharging was controlled by the diodes. In time division duplex (TDD) systems, however, the receiver (during transmit mode) is receiving a quite different signal which can re-bias the capacitor so that in returning to the receive mode the data slicer may miss the first few bits before the capacitor recovers. Moreover, although the MC3356 back to back diode scheme works well with large input signals and sufficient power supply voltages, it can not be used with low power supply voltages and low signal levels due to the bias requirement of the two back to back diodes.

Hence, there exists a need for an improved data slicer that can be utilized with reduced data input signals and time division duplex systems.

DETAILED DESCRIPTION OF THE DRAWINGS

Figure 1:
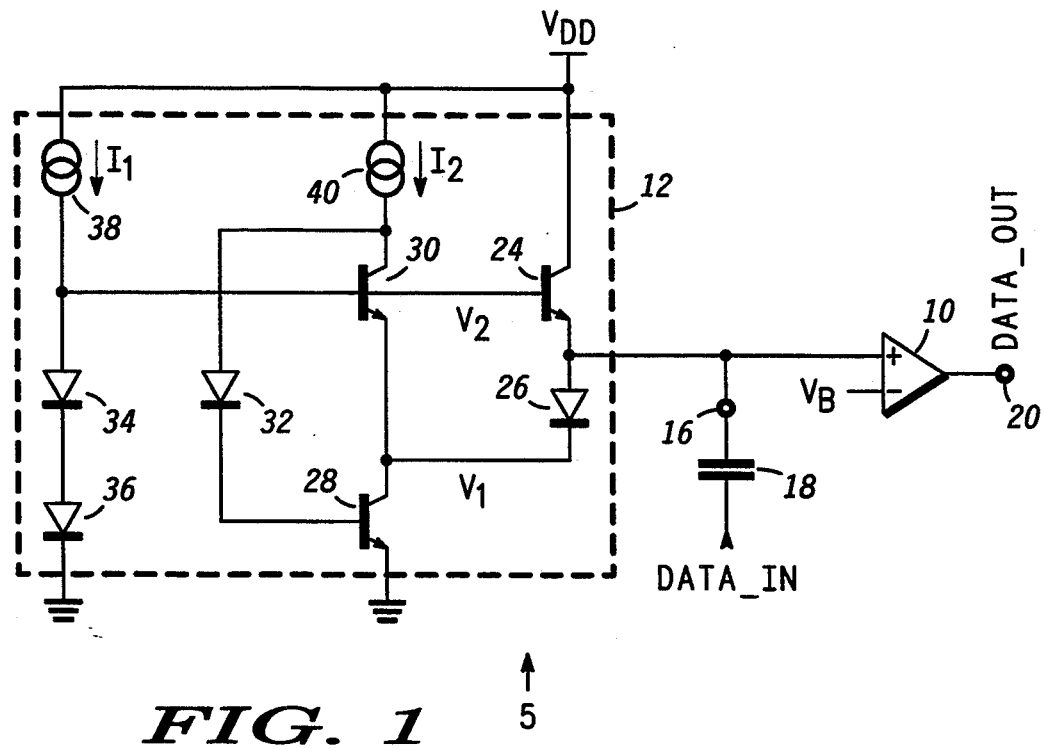
FIG. 1 is a detailed schematic diagram illustrating a data slicer in accordance with the present invention.

Referring to FIG. 1, a detailed schematic diagram illustrating data slicer 5 is shown. Data slicer 5 includes comparator 10 and clamping circuit 12. Comparator 10 has a non-inverting input coupled to terminal 16 and to clamping circuit 12. Terminal 16 is coupled through capacitor 18 to receive input data signal DATA_IN. It is understood that terminal 16 represents an input terminal to data slicer 5 and signal DATA_IN may be, for example, retrieved FSK data. The inverting input of comparator 10 is coupled to receive a bias voltage $V_B$ while the output of comparator 10 is coupled to terminal 20 for providing output data signal DATA_OUT. Clamping circuit 12 includes transistor 24 having a collector coupled to operating potential $V_{CC}$, and an emitter coupled to the non-inverting input of comparator 10. The non-inverting input of comparator 10 is also coupled to the anode of diode 26.

The cathode of diode 26 is coupled to the collector of transistor 28 and to the emitter of transistor 30 wherein the cathode of diode 26 is maintained at voltage $V_1$. The emitter of transistor 28 is returned to ground, while the base of transistor 28 is coupled to the cathode of level shift diode 32. The anode of diode 32 is coupled to the collector of transistor 30. The base of transistor 24 is coupled to the base of transistor 30 and to the anode of diode 34 wherein the base of transistor 24 is maintained at voltage $V_2$. The cathode of diode 34 is coupled to the anode of diode 36, the latter having a cathode return to ground.

The base of transistor 30 is coupled through current source 38 to operating potential $V_{CC}$. Similarly, the collector of transistor 30 is coupled through current source 40 to operating potential $V_{CC}$. It is understood that diodes 26, 32, 34 and 36 may take the form of diode-coupled transistors wherein the base and collector of each of the transistors are tied together as is well known in the art. Further, it is understood that the voltage appearing across diodes 26, 32, 34 and 36 is substantially equal to the base-emitter voltage appearing across transistors 24 and 30 which will be referred to as simply $V_{BE}$.

In operation, voltages $V_1$ and $V_2$ are maintained respectively maintained at the base of transistor 24 and the cathode of diode 26, while voltage $V_B$ is set to be substantially equal to the midpoint of voltages $V_1$ and $V_2$ ($V_B = (V_1 + V_2)/2$). This allows transistor 24 and diode 26 to clamp the signal appearing at the non-inverting input of comparator 10 between predetermined voltage levels. In particular, diode 26 is rendered operative when the voltage level at terminal 16 rises one $V_{BE}$ voltage above voltage $V_1$ thereby clamping the positive peaks occurring on signal DATA_IN to a value substantially equal to voltage $(V_1 + V_{BE})$. On the other hand, transistor 24 is rendered operative when the voltage appearing at terminal 16 falls one $V_{BE}$ voltage below voltage $V_2$ thereby clamping the negative peaks occurring on signal DATA_IN to a value substantially equal to voltage $(V_2 - V_{BE})$.

A bias circuit including transistors 30 and 28 and diodes 32, 34 and 36 function to provide voltages $V_1$ and $V_2$. In particular, voltage $V_2$ is substantially equal to two $V_{BE}$ voltages ($2V_{BE}$) via diodes 34 and 36. As a result, the base of transistor 24 is maintained at voltage $2V_{BE}$ and the emitter of transistor 24, when transistor 24 is operative, is clamped at $V_{BE}$. Therefore, when the voltage appearing at terminal 16 falls below one $V_{BE}$ voltage, transistor 24 will become operative and function to clamp the voltage appearing at terminal 16 to substantially one $V_{BE}$ voltage. In summary, transistor 24 and voltage $V_2$ are utilized to clamp a negative-going voltage signal appearing at terminal 16 to a voltage substantially equal to $(V_2 - V_{BE})$.

Voltage $V_1$ is set up to be substantially equal to one $V_{BE}$ voltage via voltage $V_2$ less the base-emitter voltage drop of transistor 30 ($V_2 - V_{BE(30)}$). As a result, since the cathode of diode 26 is clamped to one $V_{BE}$ voltage, diode 26 will be rendered operative when the voltage appearing at terminal 16 rises above two $V_{BE}$ voltages ($2V_{BE}$). When this happens, the positive going peaks occurring on signal DATA__IN are clamped to a maximum voltage of $2V_{BE}$.

It is important that the base-emitter voltage appearing across transistor 30 remains substantially constant for signal level changes appearing at terminal 16 so as to hold voltage $V_1$ substantially constant. That is, for signal level changes appearing at terminal 16, it is desired to maintain a constant current through transistor 30 so as to maintain a constant base-emitter voltage across transistor 30. This is accomplished via transistor 28 and feedback diode 32. In particular, excess current flowing through diode 26 (from terminal 16) can be absorbed by the collector of transistor 28. Further, because a base of transistor 28 is coupled through diode 32 to the collector of the transistor 30, a change in collector current through transistor 28 results in a (1/Beta) change in the collector current of transistor 30 where Beta represents the gain of transistor 30. Therefore, although the base-emitter voltage of transistor 28 may change, the base-emitter voltage of transistor 30 remains substantially constant.

Figure 2:
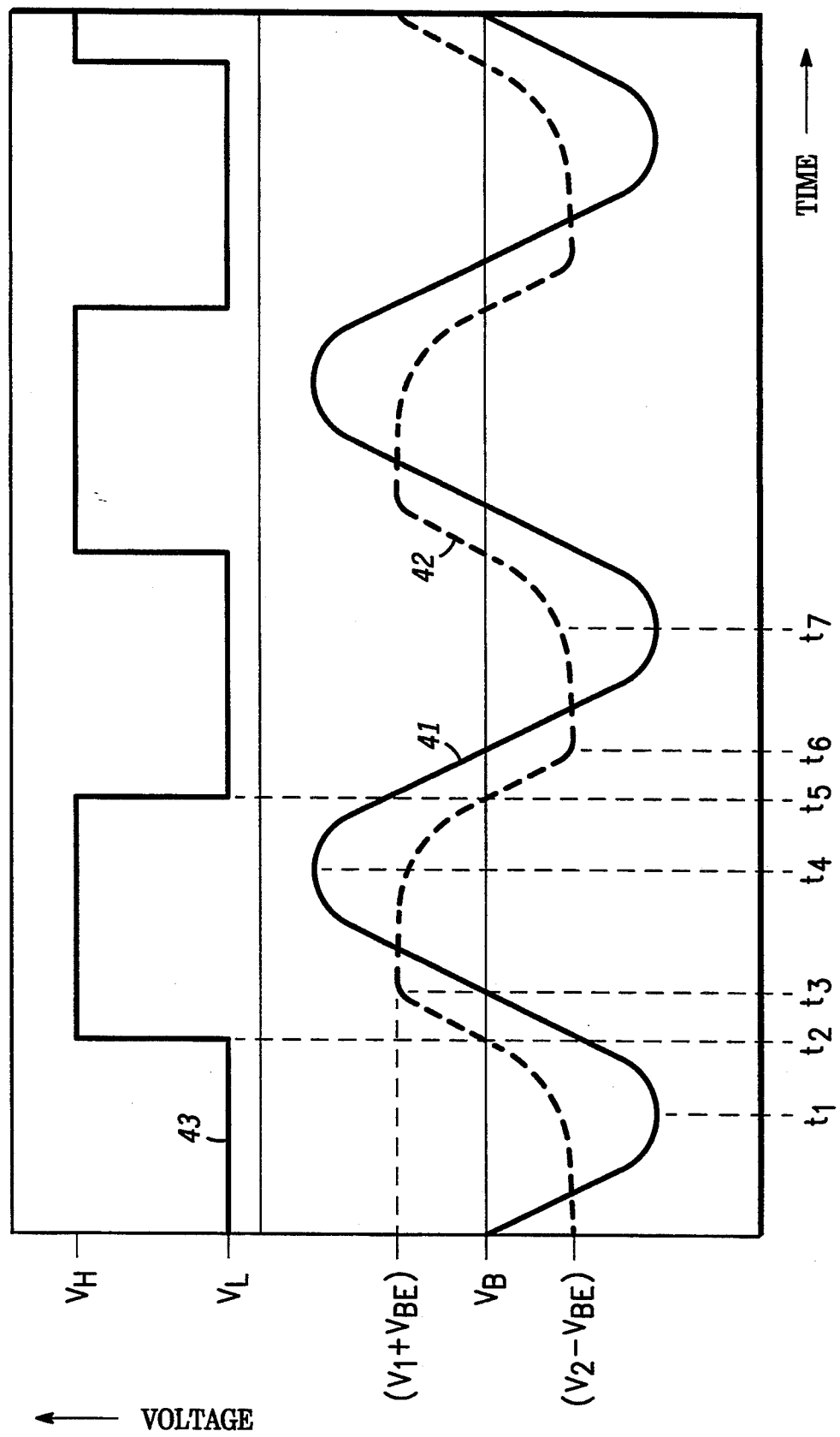
FIG. 2 illustrates waveforms useful for describing the operation of the data slicer shown in FIG. 1.

Referring to FIG. 2, a pictorial diagram illustrating waveforms useful for describing the operation of data slicer 5 of FIG. 1 is shown. Trace 41 represents at least one example of signal DATA__IN. Trace 42 represents a signal appearing at the non-inverting input of comparator 10 (which is the signal being clamped by clamping circuit 12) in response to signal DATA__IN. Finally, trace 43 represents signal DATA__OUT where $V_H$ and $V_L$ respectively represent logic high and logic low levels.

Initially let's start at time $t_1$ wherein at time $t_1$ the voltage appearing on signal DATA__IN has reached a negative peak and the voltage at terminal 16 has been clamped to voltage ($V_2 + V_{BE}$). From time $t_1$ to $t_3$, the voltage on signal DATA__IN is increasing and the voltage at terminal 16 correspondingly increases since the voltage across capacitor 18 wants to remain constant. Moreover, at time $t_2$, the voltage at terminal 16 (which is also the voltage at the non-inverting input of comparator 10) crosses bias voltage $V_B$ and comparator 10 switches from a logic low voltage level ($V_L$) to a logic high voltage level ($V_H$) as shown by trace 43.

At time $t_3$, however, the voltage at terminal 16 rises above voltage ($V_1 + V_{BE}$) which activates diode 26 thereby clamping the voltage at terminal 16 at voltage ($V_1 + V_{BE}$).

At time $t_4$, signal DATA__IN has reached a positive peak and from time $t_4$ to $t_6$, the voltage on signal DATA__IN is decreasing and the voltage at terminal 16 correspondingly decreases since the voltage across capacitor 18 wants to remain constant. Moreover, at time $t_5$, the voltage at terminal 16 crosses bias voltage $V_B$ and comparator 10 switches from a logic high voltage level to a logic low voltage level as shown by trace 43.

At time $t_6$, however, the voltage at terminal 16 falls below voltage ($V_2 - V_{BE}$) which activates transistor 24 thereby damping the voltage at terminal 16 at voltage ($V_2 - V_{BE}$). at the non-inverting input of comparator 10 tracks the signal DATA__IN since signal DATA__IN has fallen below voltage ($V_1 + V_{BE}$) and diode 26 is rendered non-operative.

Finally, at time $t_7$, the aforedescribed operation begins all over again wherein at time $t_7$ signal DATA__IN reaches another negative peak and begins to increase in voltage.

From the traces shown in FIG. 2, one can easily see that a non-square wave DATA__IN signal (trace 41) has been transformed into a clean square wave DATA__OUT signal which is desired for applications such as FSK data.

Additionally, it should be understood that by applying a bias voltage to the inverting input of comparator 10 substantially equal ($V_1 + V_2$)/2, data slicer 5 operates with small signal DATA__IN voltage swings. For example, if $V_1 = V_{BE}$, and $V_2 = 2V_{BE}$, then $V_B = 3V_{BE}/2$ and signal DATA__IN needs to have a voltage swing of only one $V_{BE}$ for clamping circuit 12 to take effect. This represents a two times improvement over the prior art which required a minimum voltage swing of $2V_{BE}$ due to the back to back diode configuration.

Figure 3:
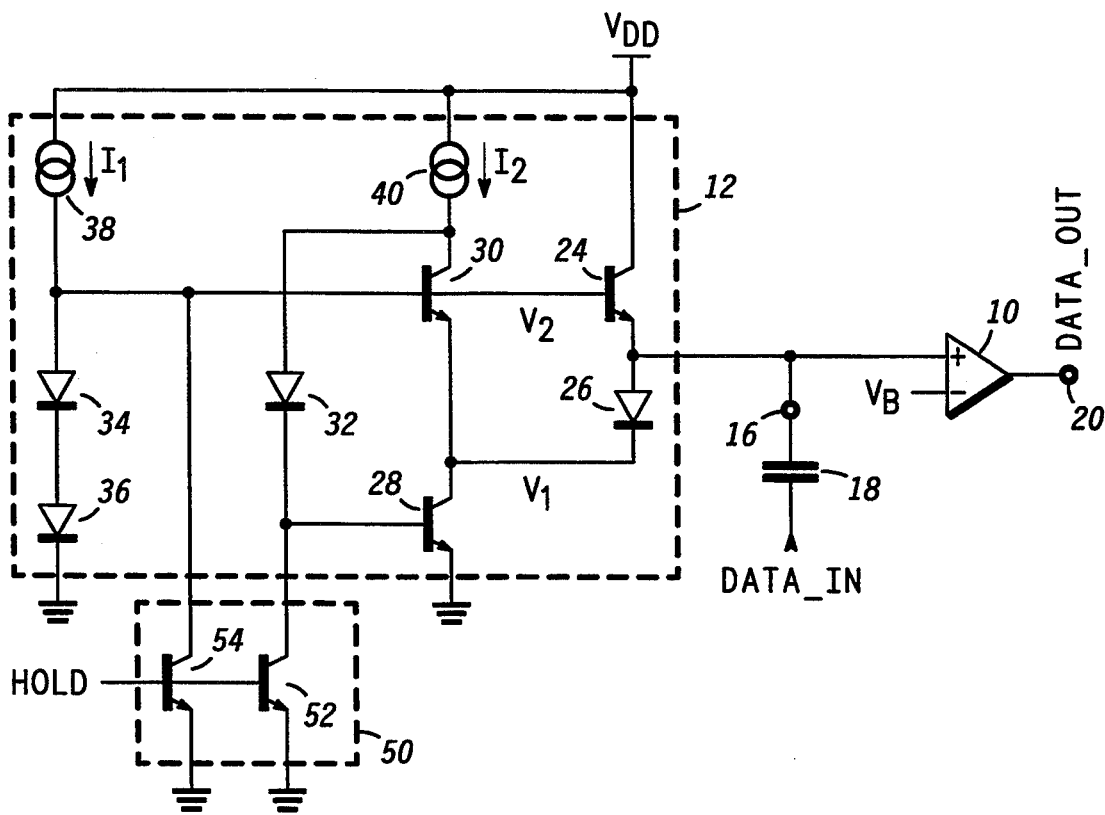
FIG. 3 is a detailed schematic diagram illustrating a data slicer with hold control in accordance with the present invention.

Referring to FIG. 3, a detailed schematic diagram illustrating data slicer 5 with hold control is shown. It is understood that components shown in FIG. 3 which are identical to components shown in FIG. 1 are identified by the same reference numbers. In addition, the circuit shown in FIG. 2 includes hold circuit 50 including transistors 52 and 54. In particular, collector of transistor 52 is coupled to the base of transistor 28 while the collector of transistor 54 is coupled to the base of transistor 30. The emitters of transistors 52 and 54 are returned to ground and the bases of transistors 52 and 54 are coupled to receive control signal HOLD.

In operation, when control signal HOLD rises above a predetermined threshold thereby rendering transistors 52 and 54 operative, transistors 52 and 54 function to sink the current provided by current sources 38 and 40 thereby removing the bias current supplied to clamp circuit 12. As a result, transistor 24 and diode 26 are disabled and no clamping action as described occurs. Thus, when hold circuit 50 is active, the signal appearing at terminal 16 is no longer being clamped. That is, terminal 16 does not effectively see the connection to the emitter of transistor 24 or to the anode of diode 26 and clamping circuit 12 now looks like an open circuit to terminal 16. Therefore, by utilizing hold circuit 50, the clamping means occurring at terminal 16 can be easily enabled or disabled.

By now it should be apparent from the foregoing discussion that a novel data slicer has been provided. The data slicer includes a comparator and a clamping circuit wherein the clamping circuit functions to clamp the data signal appearing at a first input of the comparator to a predetermined voltage swing. The first input of the comparator is coupled through a capacitive element to receive a data input signal. The clamping circuit includes a first diode being coupled between the first input of the comparator and a first voltage. The clamping circuit also includes a first transistor having its current carrying electrodes coupled between a first supply voltage terminal and the first input of the comparator and a control electrode coupled to receive a second voltage. The second input of the comparator is coupled to receive a bias voltage which is substantially equal to the midpoint of the first and second voltages. The data slicer further includes a hold circuit for disabling the clamping circuit when desired.

While the invention has been described in terms of particular arrangements and steps, these choices are for convenience of explanation and not intended to be limiting and, as those of skill in the art will understand based on the description herein, the present invention applies to other choices, arrangements and steps, and it is intended to include in the claims that follow, these and other variations as will occur to those skill in the art based on the present disclosure.

I claim:

1. A data slicer circuit having an input, which is responsive to a data signal supplied through a capacitive element, for providing a rectangular output pulse at an output, comprising:

a comparator having first and second inputs and an output, said first input of said comparator being coupled to the input of the data slicer, said second input of said comparator being coupled to receive a bias voltage, said output of said comparator being coupled to the output of the data slicer; and clamping means coupled to said first input of said comparator, said clamping including:

(a) a first transistor having a collector, a base and an emitter, said collector of said first transistor being coupled to a first supply voltage terminal, said emitter of said first transistor be coupled to said first input of said comparator;

(b) a first diode having an anode and a cathode, said anode of said first diode being coupled to said first input of said comparator; and (c) a bias circuit coupled to said base of said first transistor and said cathode of said first diode, said bias means providing a first voltage at said cathode of said first diode and a second voltage at said base of said first transistor, said bias voltage applied to said second input of said comparator being substantially equal to a midpoint voltage between said first and second voltages.

2. The data slicer according to claim 1 wherein said first and second voltages are functions of base-emitter voltages.

3. The data slicer according to claim 1 wherein said bias circuit includes:

a second transistor having a collector, a base and an emitter, said base of said second transistor being coupled to said base of said first transistor for supplying said second voltage thereto, said emitter of said second transistor being coupled to said cathode of said first diode;

a third transistor having a collector, a base and an emitter, said collector of said third transistor being coupled to said emitter of said second transistor, said emitter of said third transistor being coupled to a second supply voltage terminal;

means coupled between said collector of said second transistor and said base of said third transistor for providing a voltage level shift thereat;

voltage reference means coupled between said base of said second transistor and said second supply voltage terminal for establishing said second voltage at said base of said first transistor; and current reference means coupled to said collector of said second transistor and said voltage reference means for providing bias currents thereat.

4. The data slicer according to claim 1 further including a hold circuit for disabling said clamping means.

5. A method for providing a square wave output signal in response to an alternating input signal, the method utilizing a comparator having first and second inputs and an output, the output of the comparator providing the square wave output signal, the method comprising the steps of:

generating first and second voltages;

clamping the signal appearing at the first input of the comparator between a predetermined voltage range, said predetermined voltage range having an upper threshold substantially equal to said first voltage plus a base-emitter voltage, said predetermined voltage range having a lower threshold substantially equal to said second voltage less a base-emitter voltage;

coupling the second input of the comparator to a voltage substantially equal to a midpoint voltage between said first and second voltages thereby allowing input signals having small voltage swings to be converted to proper output square wave signals.

6. A data slicer circuit having an input, which is responsive to a data signal supplied through a capacitive element, for providing a rectangular output pulse at an output, comprising:

a comparator having first and second inputs and an output, said first input of said comparator being coupled to the input of the data slicer, said second input of said comparator being coupled to receive a bias voltage, said output of said comparator being coupled to the output of the data slicer; and a first transistor having a collector, a base and an emitter, said collector of said first transistor being coupled to a first supply voltage terminal, said emitter of said first transistor be coupled to said first input of said comparator;

a first diode having an anode and a cathode, said anode of said first diode being coupled to said first input of said comparator; and a second transistor having a collector, a base and an emitter, said base of said second transistor being coupled to said base of said first transistor, said emitter of said second transistor being coupled to said cathode of said first diode;

a third transistor having a collector, a base and an emitter, said collector of said third transistor being coupled to said emitter of said second transistor, said emitter of said third transistor being coupled to a second supply voltage terminal;

means coupled between said collector of said second transistor and said base of said third transistor for providing a voltage level shift thereat;

voltage reference means coupled between said base of said second transistor and said second supply voltage terminal for establishing a voltage at said base of said first transistor; and current reference means coupled to said collector of said second transistor and said voltage reference means for providing bias currents thereat.

7. The data slicer circuit according to claim 6 further including a hold circuit for disabling said current reference means.

8. The data slicer circuit according to claim 6 further including a hold circuit, said hold circuit includes:

a fourth transistor having a collector, a base and an emitter, said collector of said fourth transistor being coupled to said base of said third transistor, said base of said fourth transistor being coupled to receive a control signal, said emitter of said fourth transistor being coupled to said second supply voltage terminal; and a fifth transistor having a collector, a base and an emitter, said collector of said fifth transistor being coupled to said base of said second transistor, said base of said fifth transistor being coupled to receive said control signal, said emitter of said fifth transistor being coupled to said second supply voltage terminal.

* * * * *